United States Patent
Liu et al.

(10) Patent No.: US 9,564,501 B2
(45) Date of Patent: Feb. 7, 2017

(54) REDUCED TRENCH PROFILE FOR A GATE

(71) Applicants: STMICROELECTRONICS, INC., Coppell, TX (US); GLOBALFOUNDRIES INC., Grand Cayman (KY); INTERNATIONAL BUSINESS MACHINES CORPORATION, Armonk, NY (US)

(72) Inventors: Qing Liu, Watervliet, NY (US); Xiuyu Cai, Niskayuna, NY (US); Ruilong Xie, Schenectady, NY (US); Chun-chen Yeh, Clifton Park, NY (US)

(73) Assignees: STMICROELECTRONICS, INC., Coppell, TX (US); GLOBALFOUNDRIES INC., Grand Cayman (KY); INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/581,741

(22) Filed: Dec. 23, 2014

(65) Prior Publication Data
US 2016/0181384 A1    Jun. 23, 2016

(51) Int. Cl.
| | |
|---|---|
| *H01L 21/336* | (2006.01) |
| *H01L 29/423* | (2006.01) |
| *H01L 29/78* | (2006.01) |
| *H01L 29/66* | (2006.01) |
| *H01L 29/40* | (2006.01) |

(52) U.S. Cl.
CPC ......... *H01L 29/4236* (2013.01); *H01L 29/401* (2013.01); *H01L 29/42364* (2013.01); *H01L 29/6653* (2013.01); *H01L 29/6656* (2013.01); *H01L 29/66545* (2013.01); *H01L 29/7825* (2013.01)

(58) Field of Classification Search
None
See application file for complete search history.

(56) References Cited

U.S. PATENT DOCUMENTS

| | | | | |
|---|---|---|---|---|
| 2009/0189201 A1* | 7/2009 | Chang | ............... | H01L 29/66545 257/288 |
| 2009/0321856 A1* | 12/2009 | Rachmady | ........ | H01L 21/76834 257/413 |
| 2011/0031552 A1* | 2/2011 | Iwamatsu | ........... | H01L 27/1211 257/347 |
| 2012/0164830 A1* | 6/2012 | Lee | ................... | H01L 21/02063 438/675 |

(Continued)

*Primary Examiner* — Reema Patel
(74) *Attorney, Agent, or Firm* — Seed IP Law Group LLP

(57) ABSTRACT

The present disclosure is directed to a gate structure for a transistor. The gate structure is formed on a substrate and includes a trench. There are sidewalls that line the trench. The sidewalls have a first dimension at a lower end of the trench and a second dimension at an upper end of the trench. The first dimension being larger than the second dimension, such that the sidewalls are tapered from a lower region to an upper region. A high k dielectric liner is formed on the sidewalls and a conductive liner is formed on the high k dielectric liner. A conductive material is in the trench and is adjacent to the conductive liner. The conductive material has a first dimension at the lower end of the trench that is smaller than a second dimension at the upper end of the trench.

20 Claims, 7 Drawing Sheets

(56) References Cited

U.S. PATENT DOCUMENTS

2013/0095616 A1* 4/2013 Tsai ................. H01L 29/66795
                                                                438/157
2015/0236159 A1* 8/2015 He ................... H01L 29/66795
                                                                257/401

* cited by examiner

REDUCED TRENCH PROFILE FOR A GATE

BACKGROUND

Technical Field

The present disclosure is directed to a method and device having a reduced trench profile for a gate of a transistor.

Description of the Related Art

Modern transistors include fin-fet and FDSOI (fully depleted silicon on insulator) transistor structures that are taking transistors to smaller and smaller dimensions. As the transistor's sizes are shrinking the methods used to form the different structures are changing. For example, many gates in these types of transistors are formed using replacement gates or dummy gates, which are sacrificial and eventually replaced with a conductive material to form the final gate.

BRIEF SUMMARY

The present disclosure is directed to a method and device having a modified trench profile for a gate that is useful in a fin-fet transistor or a vertically oriented transistor.

In one embodiment, a device includes a transistor structure formed on a substrate. The transistor includes source-drain regions on the substrate, a trench between the source-drain regions, and first and second sidewalls in the trench. The second sidewall has a first width closer to the first sidewall and a second width spaced from the first sidewall, the second width being smaller than the first width. The transistor includes a first and second liner and a conductive material on the second liner. The conductive material is separated from the second sidewall by the liners.

The trench has a lower portion and an upper portion, the second sidewall having the first width adjacent to the lower portion of the trench and the second width adjacent to the upper portion of the trench. The device includes a self-aligned cap on the gate. The first sidewall is an oxide and the second sidewall is a silicon nitride.

In another embodiment, a method includes forming a gate of a transistor on a substrate, the forming of the gate including forming a first dielectric layer on the substrate in a trench, forming sidewalls on the first dielectric layer in the trench, the sidewalls having a first width closer to the first dielectric layer and a second width spaced from the first dielectric layer, the first width being greater than the second width, forming a second dielectric layer on the sidewalls, and forming a conductive plug on the second dielectric layer.

The method includes removing a first portion of the first dielectric layer prior to forming the second dielectric layer, a second portion of the first dielectric layer remaining between the sidewalls and the substrate. The forming of the second dielectric layer includes forming the second dielectric layer on the substrate adjacent to the second portion of the first dielectric layer. The method also includes forming source-drain regions on the substrate, the source-drain regions separated from the conductive plug by the sidewalls. The method also includes covering the gate of the transistor with a dielectric cap. The forming of the gate includes forming a liner on the second dielectric layer before forming the conductive plug.

The method also includes forming a dummy gate structure on the first dielectric layer, forming a hard mask on the dummy gate structure, and forming the sidewalls on the dummy gate structure and on the hard mask. The method includes removing a first portion of the first dielectric layer, a second portion of the first dielectric layer remaining beneath the sidewalls and the dummy gate structure, forming source-drain regions on the substrate adjacent to the sidewalls, and forming a third dielectric layer on the source-drain regions.

The method also includes making the hard mask and the third dielectric layer planar, removing the hard mask and a sacrificial portion of the sidewalls, making the dummy gate structure, the remaining sidewalls, and the second dielectric layer planar, removing a first portion of the dummy gate structure, a second portion of the dummy gate structure being adjacent to a lower portion of the remaining sidewalls, making an upper portion of the sidewalls have the second width, and removing the second portion of the dummy gate structure after the upper portion of the sidewalls have the second width.

Another embodiment is directed to a device that includes a gate structure on a substrate. The gate structure includes a trench and sidewalls that line the trench, the sidewalls having a first dimension at a first end of the trench and a second dimension at a second end of the trench, the first dimension being larger than the second dimension. The gate structure includes a first liner that is adjacent to the sidewalls and a conductive material in the trench that is adjacent to the first liner, the conductive material having a first dimension at the first end of the trench and a second dimension at the second end of the trench. The first dimension of the conductive material is smaller than the second dimension of the conductive material. The gate structure includes a second liner between the sidewalls and the first liner. The device also includes source/drain regions on the substrate surrounding the gate structure.

BRIEF DESCRIPTION OF THE SEVERAL VIEWS OF THE DRAWINGS

The foregoing and other features and advantages of the present disclosure will be more readily appreciated as the same become better understood from the following detailed description when taken in conjunction with the accompanying drawings.

DETAILED DESCRIPTION

Figure 1:
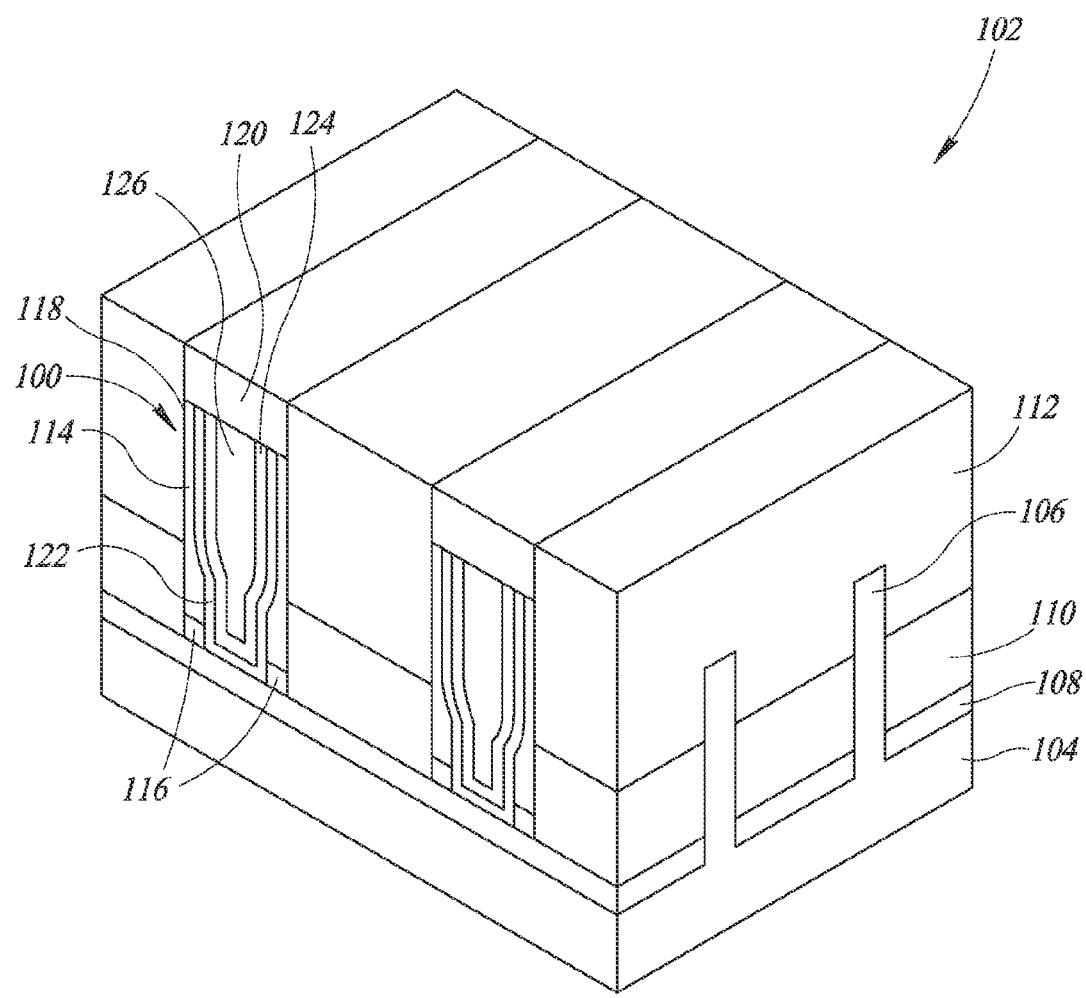
FIG. 1 is a perspective view of a gate structure formed in accordance with the present disclosure.

In the following description, certain specific details are set forth in order to provide a thorough understanding of various embodiments of the disclosure. However, one skilled in the art will understand that the disclosure may be practiced without these specific details. In some instances, well-known structures associated with semiconductor manufacturing have not been described in detail to avoid obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In the drawings, identical reference numbers identify similar features or elements. The size and relative positions of features in the drawings are not necessarily drawn to scale.

FIG. 1 is a perspective view of a gate structure 100 that is part of a transistor structure 102. The transistor structure 102 includes a substrate 104, such as a silicon semiconductor substrate. In some embodiments, the substrate 104 may be a body of a transistor, such that it forms a channel region of the transistor. The gate structure 100 can be utilized with a variety of transistor structures, such as a fin-fet transistor or an FDSOI transistor. In FIG. 1, fins 106 extend from the substrate 104. The fins may or may not be included based on the transistor structure being formed.

FIG. 1 also includes a first dielectric 108 on the substrate 104 and around the fins 106, i.e., the fins extend through the first dielectric 108. The first dielectric 108 may be an oxide or a local shallow trench isolation structure. In some embodiments, the first dielectric layer 108 is optional.

Source/drain regions 110 are formed on the first dielectric layer 108. The source/drain regions 110 may be formed as an epitaxial layer, such as a doped epitaxial layer. The source/drain regions 110 are on both sides of the fins 106. A second dielectric layer 112 is on the source/drain regions 110, around exposed portions of the fins, and adjacent to sidewalls 114 of the gate structure 100.

Advantageously, the gate structure 100 formed in accordance with the present disclosure increases an area of a conductive material 126 without an increase in a width of a trench 118 that encloses the gate structure 100. As these transistor structures continue to reduce gate length and channel length, the area available for the conductive material 126 is reduced. This reduction in area, especially for metals like tungsten, increases resistance. As will be discussed in further detail below, the gate structure 100 of the present disclosure increases the area of the conductive material 126 without increasing the gate or channel length.

The gate structure 100 includes a third dielectric layer 116 that is on the first dielectric 108 or on the substrate 104 if the first dielectric layer is omitted. The third dielectric layer 116 may be an oxide, such as a gate oxide, or other suitable dielectric. The third dielectric layer 116 is along bottom edges of the trench 118 in which the gate structure is formed. As is discussed further below, portions of the third dielectric layer 116 are removed to reexpose a surface of the first dielectric layer 108 or the substrate 104.

The sidewalls 114 extend upward from the third dielectric layer 116 along walls of the trench 118. The sidewalls 114 have a first width in a first region that is closer to the third dielectric layer 116 and a second width in second region that is closer to a cap 120. The first width is greater than the second width. This difference in dimensions for the sidewalls 114 allows for more conductive material 126 to be formed in the gate structure. This will be discussed in further detail below.

A fourth dielectric layer 122 is formed in the trench 118 along the sidewalls 114. The fourth dielectric layer 122 is adjacent to the first dielectric layer 108 and between the portions of the third dielectric layer 116. The fourth dielectric layer 122 may be a high k dielectric, such as hafnium dioxide, $HfO_2$ or other suitable dielectric.

A liner 124 is formed on the fourth dielectric layer 122 in the trench. The liner conforms to the shape of the fourth dielectric layer 122. The conductive material 126 is formed in the trench 118 on the liner 124. The conductive material may be referred to as a conductive plug. The cap 120 is a self-aligned cap that may be silicon nitride or other suitable material. The conductive material 126 may be tungsten.

As a result of the sidewalls 114 having the first width and the second width, an upper portion of the conductive material is wider than a lower portion of the conductive material. This increases the overall area covered by the conductive material and improves conductivity. Without a change to the footprint of the gate structure in the transistor, a resistance of the conductive material is reduced by increasing the area.

Figure 2:
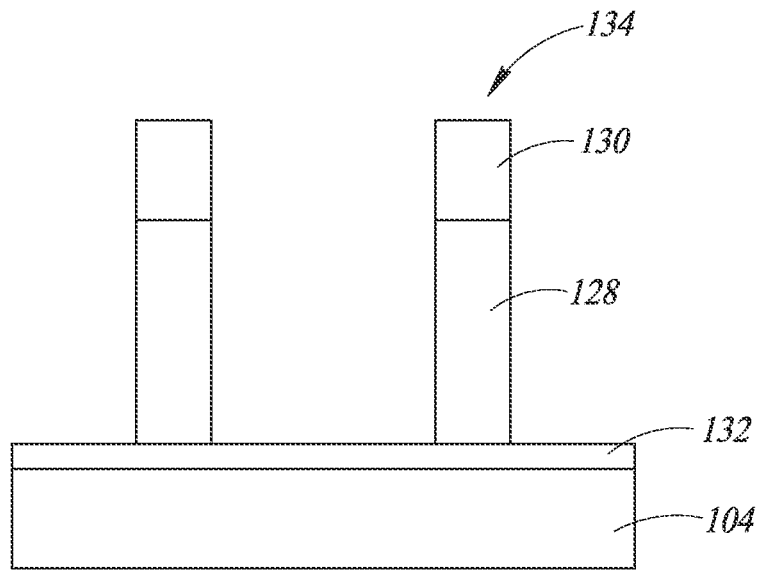
FIGS. 2-10 are a plurality of steps for forming a gate structure in accordance with an embodiment of the present disclosure.

FIGS. 2-10 are a plurality of steps of forming an alternative embodiment of the gate structure 100 of FIG. 1. Where elements are the same as those in FIG. 1, the same reference numbers are used. In FIG. 2, a dummy gate 128 or a replacement gate 128 is provided on a dielectric layer 132. The dielectric layer 132 may be directly on the substrate 104 or may be on additional active or dielectric layers as useful for the transistor structure being formed. The dielectric layer 132 may be an oxide that has a thickness in the range of 3 and 5 nanometers. The substrate 104 may be a thin silicon layer for use in an FDSOI transistor structure. Alternatively, the substrate 104 may be a fin in a fin-fet transistor structure.

A hard mask 130 is included on the replacement gate 128. A stack 134 of the hard mask 130 and the replacement gate 128 may be formed by forming layers of each and then etching to form the stack. The replacement gate 128 may be polysilicon that has a thickness in the range of 60 and 100 nanometers. The hard mask may be silicon nitride having a thickness in the range of 30 and 50 nanometers. The etching may be a reactive ion etching.

Figure 3:
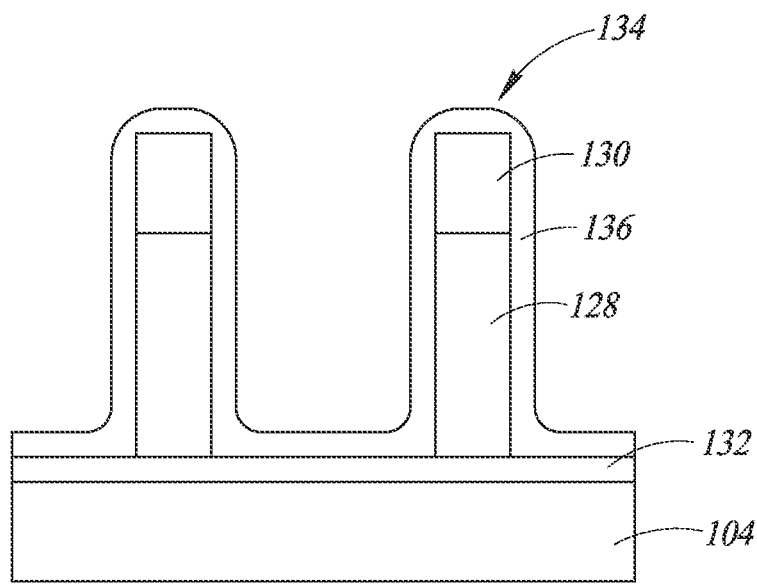
Figure 4:
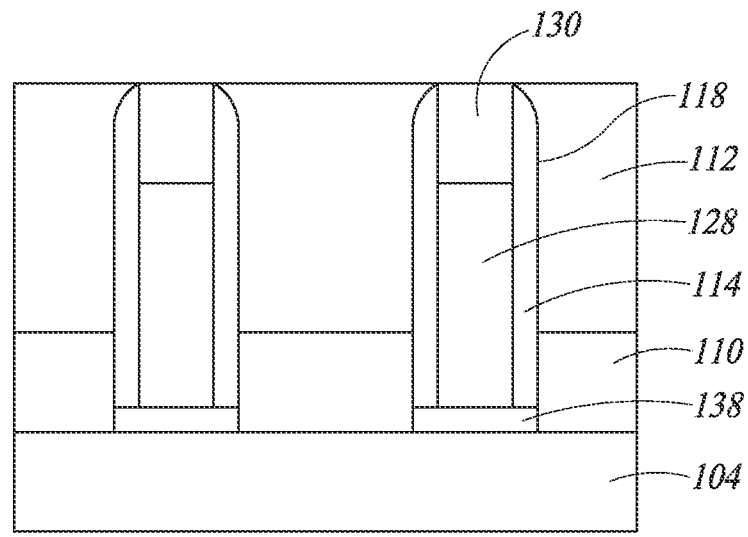

In FIG. 3, a layer of sidewall material 136 is formed over the stack 134. It is deposited over all of the features and then followed by an etch, which may be a directional etch. The etch may also be a reactive ion etch that stops on the hard mask 130. The sidewall material 136 may have a thickness in the range of 6 and 12 nanometers. As in FIG. 4, the remaining sidewall material 136 forms the sidewalls 114 in the trench 118. A top of the sidewalls 114 is curved, leaving relatively vertical edges along the trench 118.

Portions of the dielectric layer 132 are removed leaving a dielectric portion 138 under the dummy gate 128 and the sidewalls 114. Then the source/drain regions 110 are formed adjacent to the sidewalls 114 and on the substrate 104. These source/drain regions 110 are raised source/drain regions, which may be formed from epitaxial layers that may be doped. A flowable dielectric 112 is formed on the source/drain regions 110. The flowable dielectric 112 may be an interlevel dielectric, such as a flowable oxide, that is followed by a planarization step. This planarization may be a chemical mechanical polish.

Figure 5:
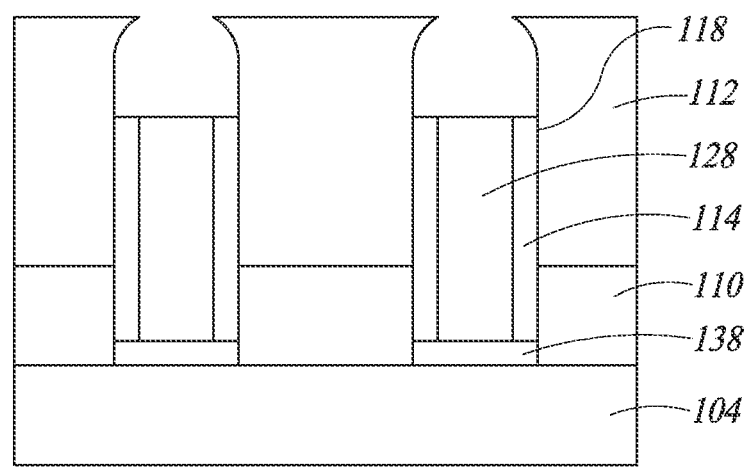
Figure 6:
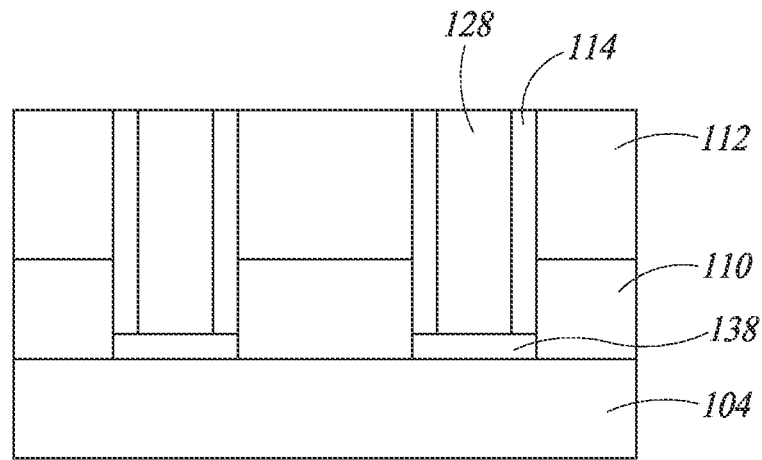

In FIG. 5, the hard mask 130 and upper portions of the sidewalls 114 are removed. The removal may be a wet etch. In FIG. 6, the structure is subjected to a planarization. For example, the planarization may be a chemical mechanical polish that removes a portion of the dielectric 112 and stops on the dummy gate 128. The dummy gate 128, the sidewall 114, and the dielectric 112 are coplanar.

Figure 7:
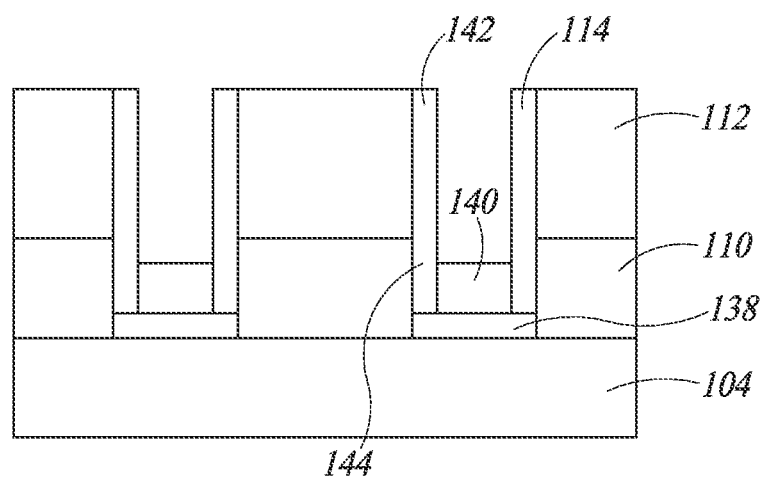

In FIG. 7, an upper portion of the replacement gate 128 is removed and a lower portion 140 of the replacement gate 128 remains. This partial pull or partial removal of the replacement gate exposes a first portion 142 of the sidewalls 114. A second portion 144 of the sidewalls 114 is covered or shielded by the lower portion 140 of the replacement gate 128. The partial pull leaves one quarter to one fifth of the replacement gate 128, such that the lower portion 140 is one quarter to one fifth of the total replacement gate 128. The partial pull may be performed by a dry or wet etch or a combination of both.

Figure 8:
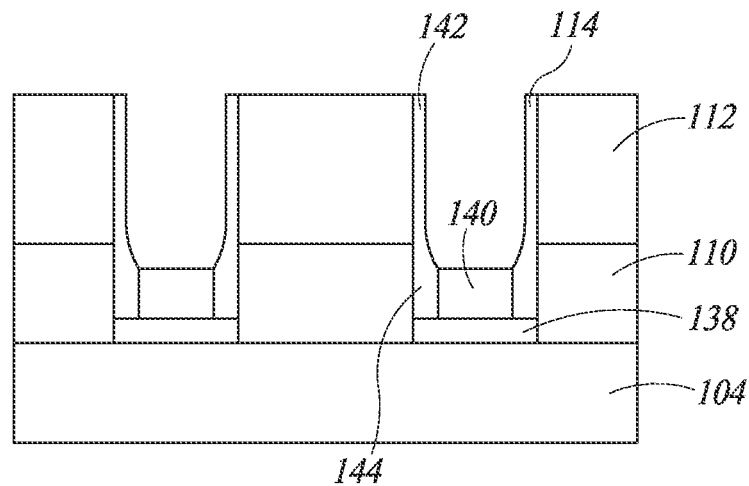

In FIG. 8, a thickness of the first portion 142 of the sidewalls 114 is reduced. The second portion 144 of the sidewalls 114 maintains its original thickness because the lower portion 140 of the replacement gate 128 protects the second portion 144 during the process to reduce the thickness of the first portion 142. In one embodiment, the first portion 142 may start with a thickness that is around 10 nanometers. After the reduction process, the first portion 142 may have a thickness that is in the range of 6 and 8 nanometers, which results in a widening of a space between the first portions 142 of 4 and 8 nanometers.

This reduction in thickness is a compressing process that causes the first portion 142 to densify or otherwise increase the density of the material. One option for compressing the first portion 142 is a UV cure process. In particular, if the sidewalls 114 are formed of nitride, the UV cure can shrink the thickness by increasing the density of the nitride in the first portion 142 of the sidewalls by 14-18%, such as a shrinkage of 16%. Accordingly, the first portion 142 will have a different density than the second portion 144.

The UV cure can cause compression at exposed surfaces of nitride. The UV process may be performed with a thermal anneal treatment. For example, at 400 degrees Celsius nitride densifies with little hydrogen removal with a UV treatment, which results in the shrinkage between 14 and 16% over a selected time period. For example, at an anneal time of 40 minutes the shrinkage may be around 14%. At around 60 minutes, the shrinkage may be around 15%. At 120 minutes of anneal time at 400 degrees Celsius, the shrinkage of the first portion 142 may be around 16%.

Shrinkage may be achieved without a UV cure, however, the reduction in thicknesses may not be a great as with the UV cure. For example, with only the application of heat, a thermal anneal of 400 degree Celsius, the thickness of the sidewalls may only be reduced by 1% after a 120 minute anneal. At 450 degrees Celsius after 120 minute anneal, the thickness may be reduced by up to 4%. At 500 degrees Celsius after 120 minute anneal, the thickness may be reduced by up to 7%. At 550 degrees Celsius with a 120 minute anneal, the thickness may be reduced by up to 10%. Depending on the desired reduction, the manufacturer may select a UV cure or simply an anneal.

Figure 9:
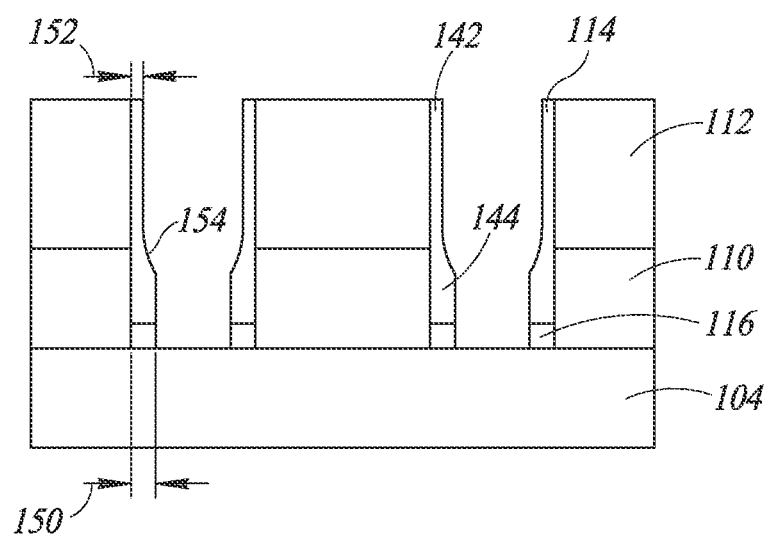

In FIG. 9, the lower portion 140 of the replacement gate is removed leaving the sidewalls 144 where the second portion 144 has a first width 150 and the first portion 142 has a second width 152. The first width 150 is greater than the second width 152. There is a taper 154 between the first portion 142 and the second portion 144 as the first width transitions to the second width.

Figure 10:
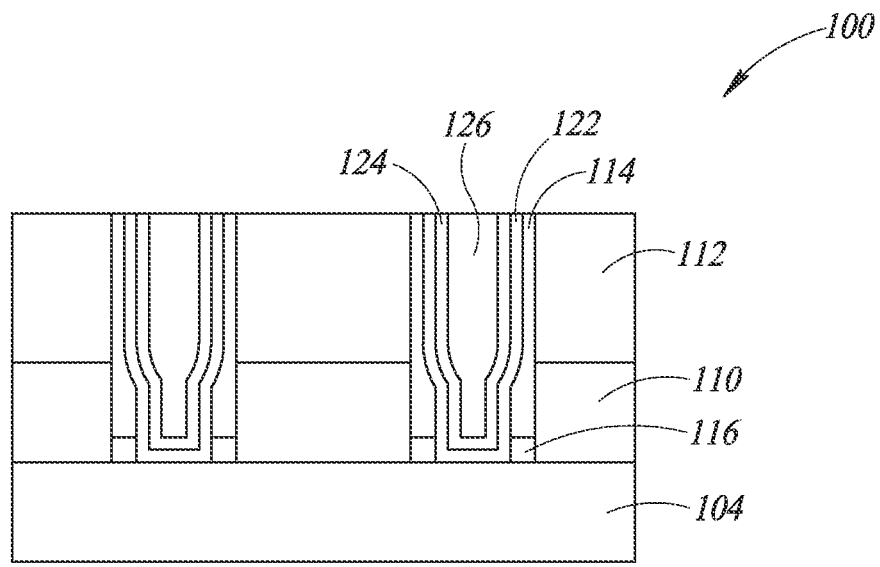

In FIG. 9, the dielectric portion 138 is etched using the second portion 144 of the sidewalls 114 to reexpose the substrate 104. In FIG. 10, the final portions of the gate structure 100 are formed. The dielectric layer 122 is formed adjacent to the sidewalls 114 and on the reexposed surface of the substrate. The dielectric may be a high k dielectric such as hafnium oxide with a thickness in the range of 1 and 2 nanometers. The dielectric layer 122 may be a conformal deposition.

The liner 124 is formed on the dielectric layer 122. The liner may be a titanium nitride or a titanium carbide liner that may have a thickness in the range of 3 and 5 nanometers. The liner may be formed by chemical vapor deposition or other suitable process. Next, the conductive material 126 is formed on the liner 124. The conductive material 126 may be tungsten. The dielectric layer 122, the liner 124, and the conductive material 126 may be formed consecutively and followed by a chemical mechanical polish.

In FIGS. 2-10, the gate structure 100 may be formed on a fin, such that the substrate 104 is part of a fin or may be formed on an active area of a semiconductor substrate. An overall height of the gate structure may vary depending on whether the one is viewing the gate structure formed on the fin of a fin-fet transistor or on the substrate for a different transistor structure.

Figure 11:
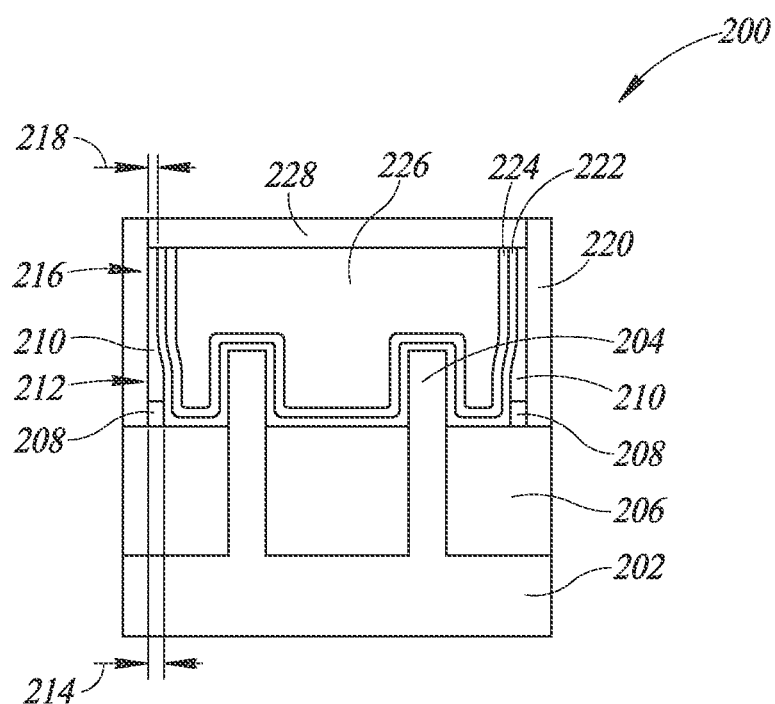
FIG. 11 is an alternative view of a gate structure formed in accordance with an embodiment of the present disclosure.

FIG. 11 is an alternative embodiment of a gate structure 200 that is in a fin-fet transistor. The gate structure 200 is formed on a substrate 202 that includes a plurality of fins 204 extending from the substrate 202. An isolation region 206 is on the substrate 202 and on both sides of the fins 204. The gate structure 200 is formed on the isolation region 206 and adjacent to sides and tops of the fins 204. An interlevel dielectric 220 surrounds the gate structure 200.

The gate structure 200 includes a first sidewall 208 and a second sidewall 210. The first sidewall 208 is what remains of an oxide layer utilized in the process of forming the gate structure. The first sidewall 208 and a first portion 212 of the second sidewall are a same or similar first width 214. A second portion 216 of the second sidewall 210 has a second width 218 that is smaller than the first width. The second sidewall 210 may be a silicon nitride or other suitable material that can be reduced in size, such as by increasing the density, during manufacturing. The sidewall 210 includes a taper as the first width transitions into the second width.

A first liner 222 is formed or deposited on the first and second sidewalls 208, 210, the isolation region 206, and on the fins 204. The first liner 222 is a dielectric, such as a high k dielectric.

A second liner 224 is formed or deposited on the first liner 222. The second liner may be a conductive liner suitable to be used with a conductive material 226, which is formed on the second liner. For example, if the conductive material 226 is tungsten, the liner may be a titanium liner. A self-aligned cap 228 is formed on first and second liner and on the conductive material.

Figure 12:
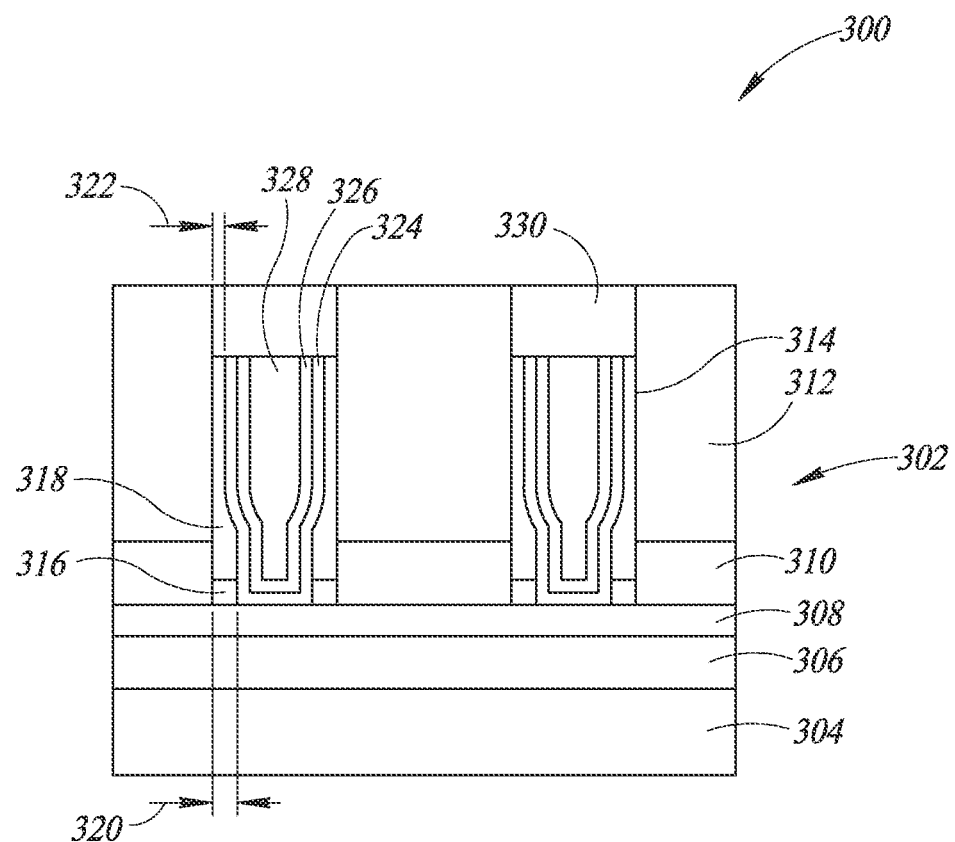
FIG. 12 is an alternative view of a gate structure formed in accordance with another embodiment of the present disclosure.

FIG. 12 is an alternative embodiment of a gate structure 300 for an FDSOI transistor 302. The FDSOI transistor includes a silicon substrate 304 or other suitable substrate. A buried oxide 306 is formed on the substrate 304. In one embodiment, the buried oxide 306 has a thickness in the range of 10 and 30 nanometers. An active layer 308 is formed on the buried oxide 306. For example, the active layer 308 may be silicon for an NFET or silicon germanium for a PFET.

Source/drain regions 310 are formed on the active layer 308. An interlevel dielectric 312 is formed on the source/drain regions 310. A trench 314 is defined or otherwise delimited by the source/drain regions 310 and the interlevel dielectric 312.

A lower sidewall 316 is formed in the trench 314 on the active layer 308. An upper sidewall 318 is formed on the lower sidewall 316. The upper sidewall has a lower dimension 320 and an upper dimension 322. The upper dimension 322 is smaller than the lower dimension 320.

A thin dielectric 324 lines an interior of the trench and is adjacent to the lower sidewall 316 and the upper sidewall 318. A liner 326 is adjacent to the thin dielectric 324. A conductive material 328 fills the remainder of the trench. A cap 330 is on top of the conductive material 328, the liner 326, the thin dielectric 324, and the upper sidewall 318.

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
   a substrate;
   a transistor structure formed on the substrate, the transistor including:
   a doped layer on the substrate;
   source-drain regions in the doped layer;
   a trench through the doped layer and between the source-drain regions;
   a first sidewall in the trench;
   a second sidewall in the trench on the first sidewall, the second sidewall including:
   a first portion having a first width;
   a second portion having a second width, the second width being smaller than the first width; and
   a curved portion between the first portion and the second portion, the curved portion having a third width that transitions from the first width to the second width, the first portion, the second portion, and the curved portion being aligned along a first direction, the curved portion and the source-drain regions being aligned along a second direction that is substantially perpendicular to the first direction;
   a first liner; and
   a conductive material that is separated from the second sidewall by the first liner.

2. The device of claim 1 wherein the transistor structure includes a second liner between the first liner and the conductive material.

3. The device of claim 1 wherein the trench has a lower portion and an upper portion, the second sidewall having the first width adjacent to the lower portion of the trench and the second width adjacent to the upper portion of the trench.

4. The device of claim 1 wherein the transistor structure includes a self-aligned cap on the conductive material.

5. The device of claim 1 wherein the first sidewall is an oxide and the second sidewall is a silicon nitride.

6. The device of claim 1 wherein the first liner is formed on the substrate between portions of the first sidewall and a second liner is formed on the first liner.

7. The device of claim 6 wherein the second liner is a titanium based liner.

8. A device, comprising:
   a substrate;
   a doped layer on top of the substrate;
   source-drain regions in the doped layer;
   a gate structure, including:
   a trench in the doped layer;
   sidewalls that line the trench, the sidewalls including:
   a first portion at a first end of the trench, the first portion having a first planar surface and a second planar surface opposite to the first planar surface, the first portion having a first distance between the first planar surface and the second planar surface;
   a second portion at a second end of the trench, the second portion having a third planar surface and a fourth planar surface opposite to the third planar surface, the second portion having a second distance between the third planar surface and the fourth planar surface, the first distance being larger than the second distance; and
   a third portion between the first portion and the second portion, the third portion having a fifth planar surface and a curved surface opposite to the fifth planar surface, the third portion being closer to the first end than to the second end of the trench;
   a first liner that is adjacent to the sidewalls; and
   a conductive material in the trench that is adjacent to the first liner, the conductive material having a first dimension at the first end of the trench and a second dimension at the second end of the trench.

9. The device of claim 8 wherein the first dimension of the conductive material is smaller than the second dimension of the conductive material.

10. The device of claim 8 wherein the gate structure includes a second liner between the sidewalls and the first liner.

11. A device, comprising:
   a substrate;
   a doped layer on top of the substrate;
   source and drain regions formed in the doped layer;
   a first dielectric layer on the doped layer;
   a fin having a first portion extending from the substrate through the doped layer and a second portion extending at least partially into the first dielectric layer;
   a trench through the first dielectric layer and the doped layer;
   a gate structure in the trench, the gate structure overlapping the fin, the gate structure including:
   a sidewall having a first thickness closer to the substrate and lateral to the first portion of the fin, and a second thickness closer and lateral to the second portion of the fin, the first thickness being greater than the second thickness.

12. The device of claim 11 wherein the gate structure includes a first liner on the sidewall.

13. The device of claim 12 wherein a first liner abuts a top surface of the substrate.

14. The device of claim 12 wherein the gate structure includes a second liner on the first liner.

15. The device of claim 11 wherein the gate structure includes a conductive plug between the sidewalls.

16. A device, comprising:
   a substrate;
   a doped layer on the substrate, the doped layer including source-drain regions;
   a first dielectric layer on the doped layer;
   a trench through the doped layer and the first dielectric layer;
   a gate structure in the trench, the gate structure including conductive material, the conductive material including:
   a first portion having a first thickness;
   a second portion having a second thickness that is greater than the first thickness; and a curved portion between the first portion and the second portion, the curved portion having a third thickness that transitions from the first thickness to the second thickness, the first portion and the curved portion being lateral to the doped layer, the second portion being lateral to the first dielectric layer.

17. The device of claim 16, wherein the gate structure further includes a sidewall having a third portion and a fourth portion, the third portion having a fourth thickness, the fourth portion having a fifth thickness that is less than the fourth thickness, the third portion being lateral to the first portion of the conductive material, the fourth portion being lateral to the second portion of the conductive material.

18. The device of claim 16, further comprising a cap overlying the gate structure, the cap being in the trench.

19. The device of claim 16, further comprising a second dielectric layer between the substrate and the doped layer.

20. The device of claim 16, wherein the gate structure further includes:
  a sidewall; and
  a conformal liner formed in the trench, on a part of the substrate within the trench, and adjacent to the sidewall.

* * * * *